US010761111B2

(12) United States Patent
Adoni et al.

(10) Patent No.: US 10,761,111 B2
(45) Date of Patent: Sep. 1, 2020

(54) SYSTEM AND METHOD FOR CONTROL OF AUTOMATED TEST EQUIPMENT CONTACTOR

(71) Applicant: TEXAS INSTRUMENTS INCORPORATED, Dallas, TX (US)

(72) Inventors: Arun Adoni, Secunderabad (IN); Suvadip Banerjee, Bangalore (IN); Sreeram Subramanyam Nasum, Bangalore (IN); Prajkta Vyavahare, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 309 days.

(21) Appl. No.: 15/989,126

(22) Filed: May 24, 2018

(65) Prior Publication Data
US 2018/0340961 A1    Nov. 29, 2018

(30) Foreign Application Priority Data
May 25, 2017   (IN) .............................. 201741018351

(51) Int. Cl.
G01R 1/067      (2006.01)
G01R 31/28      (2006.01)
G01R 35/00      (2006.01)

(52) U.S. Cl.
CPC ..... *G01R 1/06766* (2013.01); *G01R 31/2834* (2013.01); *G01R 35/00* (2013.01)

(58) Field of Classification Search
CPC . G01R 1/06766; G01R 31/2834; G01R 35/00
(Continued)

(56) References Cited

U.S. PATENT DOCUMENTS 5,414,609 A    5/1995 Levran et al.
6,147,393 A    11/2000 Zommer
(Continued)

FOREIGN PATENT DOCUMENTS

JP    6-251995    9/1994

OTHER PUBLICATIONS

"Non-haloganated Low CTE BT Resin Laminate for IC Plastic Packages", MGC Mitsubishi Gas Chemical Company, Inc., pp. 1-5, available at www.jgc.co.jp/eng/products/lm/btprint/lineup/hfbt.html on Aug. 26, 2013.
(Continued)

*Primary Examiner* — Melissa J Koval
*Assistant Examiner* — Rahul Maini
(74) *Attorney, Agent, or Firm* — John R. Pessetto; Charles A. Brill; Frank D. Cimino

(57) ABSTRACT

A system includes a controller for automated test equipment (ATE) contactor to interface with a device under test (DUT) including a power converter having a primary and secondary side, each side has an input/output (I/O) pin. The controller causes the ATE contactor to apply a load current on the secondary side of the power converter at a first value and vary the load current to a second value. The contactor receives first and second indications, at the first and second load currents, of a voltage on the primary side I/O pin, a voltage on the primary side of the power converter, an input current on the primary side of the power converter, a voltage on the secondary side I/O pin, and a voltage on the secondary side of the power converter. The controller determines a primary and secondary side ATE contactor resistances based on the first and second indications.

18 Claims, 4 Drawing Sheets

(58) Field of Classification Search
USPC .................................................. 324/750.01
See application file for complete search history.

(56) References Cited

U.S. PATENT DOCUMENTS

| | | | |
|---|---|---|---|
| 6,456,511 | B1 | 9/2002 | Wong |
| 8,436,709 | B2 | 5/2013 | Fouquet et al. |
| 8,466,535 | B2 | 6/2013 | Hopper et al. |
| 8,674,418 | B2 | 3/2014 | Poddar et al. |
| 9,035,422 | B2 | 5/2015 | Khanolkar et al. |
| 2006/0022650 | A1* | 2/2006 | Vinciarelli ........ H02M 3/33523 323/266 |
| 2007/0058402 | A1 | 3/2007 | Shekhawat et al. |
| 2007/0188288 | A1 | 8/2007 | Ishii |
| 2009/0185397 | A1 | 7/2009 | Forghani-zadeh et al. |
| 2011/0199799 | A1 | 8/2011 | Hui et al. |
| 2012/0002377 | A1 | 1/2012 | French et al. |
| 2012/0099345 | A1 | 4/2012 | Wong |
| 2013/0001735 | A1 | 1/2013 | Hopper et al. |
| 2013/0037908 | A1 | 2/2013 | Hopper et al. |
| 2013/0037909 | A1 | 2/2013 | French et al. |
| 2016/0006356 | A1 | 1/2016 | Nirantare et al. |
| 2016/0118904 | A1 | 4/2016 | Yoshikawa et al. |
| 2016/0149504 | A1 | 5/2016 | Quigley |
| 2016/0352237 | A1 | 12/2016 | Quigley |

OTHER PUBLICATIONS

"G200 BT/Epoxy Laminate and Prepreg", Isola Laminate Systems Corp., Data Sheet #5027/3/01, pp. 1-2, 1999.

"LTM2881 Complete Isolated RS485/RS422 uModule Transceiver + Power", Linear Technology Corporation, LT0213 Rev F, pp. 1-24, 2009.

David Krakauer, "Anatomy of a Digital Isolator", Analog Devices, Inc., Technical Article MS-2234, pp. 1-3, Oct. 2011.

* cited by examiner

SYSTEM AND METHOD FOR CONTROL OF AUTOMATED TEST EQUIPMENT CONTACTOR

CROSS-REFERENCE TO RELATED APPLICATIONS

The present application claims priority to Indian Provisional Patent Application No. 201741018351, which was filed May 25, 2017, is titled "Max IOUT Final Test Screen For Integrated Power Converters," and is hereby incorporated herein by reference in its entirety.

BACKGROUND

None.

SUMMARY

In accordance with at least one example of the disclosure, a system includes a controller for an automated test equipment (ATE) contactor configured to interface with a device under test (DUT) including a power converter having a primary side and a secondary side, each of the primary and secondary sides additionally having an input/output (I/O) pin. The controller is configured to cause the ATE contactor to apply a load current on the secondary side of the power converter at a first value and receive a first indication from the ATE contactor of a voltage on the primary side I/O pin, a voltage on the primary side of the power converter, an input current on the primary side of the power converter, a voltage on the secondary side I/O pin, and a voltage on the secondary side of the power converter when the load current is the first value. The controller is also configured to cause the ATE contactor to vary the load current to a second value and receive a second indication from the ATE contactor of the voltage on the primary side I/O pin, the voltage on the primary side of the power converter, the input current on the primary side of the power converter, the voltage on the secondary side I/O pin, and the voltage on the secondary side of the power converter when the load current is the second value. The controller is then configured to determine a primary side ATE contactor resistance based on the first and second indications of the voltage on the primary side I/O pin, the voltage on the primary side of the power converter, and the input current on the primary side of the power converter and determine a secondary side ATE contactor resistance based on the first and second load current values and the first and second indications of the voltage on the secondary side I/O pin and the voltage on the secondary side of the power converter.

In accordance with other examples of the disclosure, a method for controlling an automated test equipment (ATE) contactor includes providing the ATE contactor to interface with a device under test (DUT), the DUT comprising a power converter having a primary side and a secondary side, each of the primary and secondary sides additionally comprising an input/output (I/O) pin. The method also includes measuring each of a voltage on the primary side I/O pin, a voltage on the primary side of the power converter, an input current on the primary side of the power converter, a voltage on the secondary side I/O pin, and a voltage on the secondary side of the power converter at multiple load current values on the secondary side of the DUT. The method continues with determining a primary side ATE contactor resistance based on the voltages on the primary side I/O pin, the voltages on the primary side of the power converter, and the input currents on the primary side of the power converter measured at the multiple load current values. The method also includes determining a secondary side ATE contactor resistance based on the multiple load current values and the voltages on the secondary side I/O pin and the voltages on the secondary side of the power converter measured at the multiple load current values.

In accordance with yet other examples of the disclosure, a system includes a controller for an automated test equipment (ATE) contactor configured to interface with a device under test (DUT) including a power converter having a primary side and a secondary side, each of the primary and secondary sides additionally having an input/output (I/O) pin. The controller is configured to measure each of a voltage on the primary side I/O pin, a voltage on the primary side of the power converter, an input current on the primary side of the power converter, a voltage on the secondary side I/O pin, and a voltage on the secondary side of the power converter, at multiple load current values on the secondary side of the DUT. The controller is also configured to determine a primary side ATE contactor resistance based on the voltages on the primary side I/O pin, the voltages on the primary side of the power converter, and the input currents on the primary side of the power converter measured at the multiple load current values. The controller is configured to determine a secondary side ATE contactor resistance based on the multiple load current values and the voltages on the secondary side I/O pin and the voltages on the secondary side of the power converter measured at the multiple load current values.

BRIEF DESCRIPTION OF THE DRAWINGS

For a detailed description of various examples, reference will now be made to the accompanying drawings in which.

DETAILED DESCRIPTION

Automated test equipment (ATE) includes combinations of hardware and software used to perform tests on a device, often referred to as a device under test (DUT), such as a silicon wafer, a packaged integrated circuit (IC), or the like. An ATE contactor is a hardware element that physically interfaces with the DUT; for example, a socket is used to interface with the pins of a packaged IC, or a prober is used to interface with a silicon wafer. Certain DUTs include an integrated power converter, and one test for such devices is a Max Iout test, which refers to the maximum current load capability for the power converter while maintaining a direct current (DC) output voltage within a DC load regulation specification for the DUT. However, the ATE contactor introduces an additional DC resistance component, which is both unknown and changes from testing one DUT to testing another DUT. Due to the ATE contactor resistance, the voltage actually applied to the DUT—more specifically, to the integrated power converter of the DUT—differs from that which is specified to perform a Max Iout test, degrading the performance of the power converter by causing an additional DC voltage drop in the path to the power converter. As a result, DUTs must either be overdesigned to satisfy a Max Iout specification, have their Max Iout specification underrated, or else otherwise-good DUTs may be discarded for appearing to fail the Max Iout test.

In accordance with examples of the present disclosure, a controller for an ATE contactor is provided that determines or estimates the ATE contactor resistances. The controller then corrects the voltage that is applied through the ATE contactor to a power converter of a DUT such that the voltages applied to the terminals of the power converter are appropriate for performing a Max Iout test of the power converter. Once the appropriate voltages are applied to the terminals of the DUT power converter, the controller then determines a Max Iout value based on the current provided by the secondary side of the power converter. Other examples of the present disclosure may be applied to correct for ATE contactor resistances for the purposes of performing any test on a DUT where a series resistance value is critical for the effectiveness of that test. One such test is a test to determine a DUT's drain-source on resistance, also referred to as an RDS(on) test.

Figure 1:
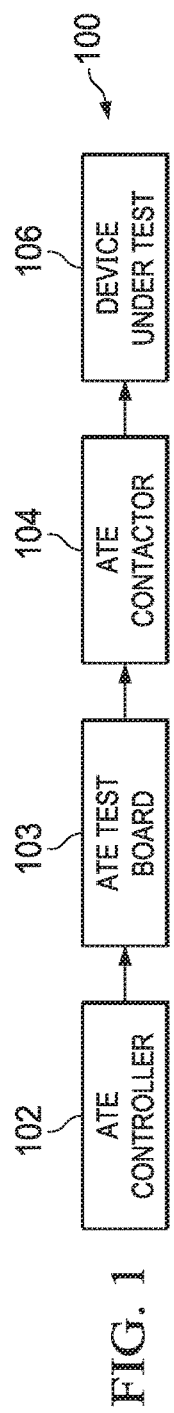
FIG. 1 shows a block diagram of a system including automated test equipment (ATE) for a device under test (DUT) in accordance with various examples.

FIG. 1 shows a system 100 that includes such a controller 102 to control and receive data from an ATE contactor 104 through, for example, an ATE test board 103. The ATE contactor 104 interfaces with a DUT 106, and is thus the mechanical interface between the DUT 106 and the ATE controller 102 and ATE test board 103. As explained above, the ATE contactor 104 could comprise a socket that receives a packaged IC or chip, or the ATE contactor 104 could comprise a prober that contacts the surface of a silicon wafer. The present disclosure is not limited to a particular type of ATE contactor 104, but rather applies generally to ATE contactors 104 that include a parasitic DC resistance component, which affects voltages applied to a DUT 106.

The controller 102 is configured to control the ATE contactor 104, for example, to apply various voltages or currents to the DUT 106. The controller 102 also receives data from the ATE contactor 104, such as various voltage levels of pins of the DUT 106 and current drawn by or sourced from the DUT 106.

Figure 2:
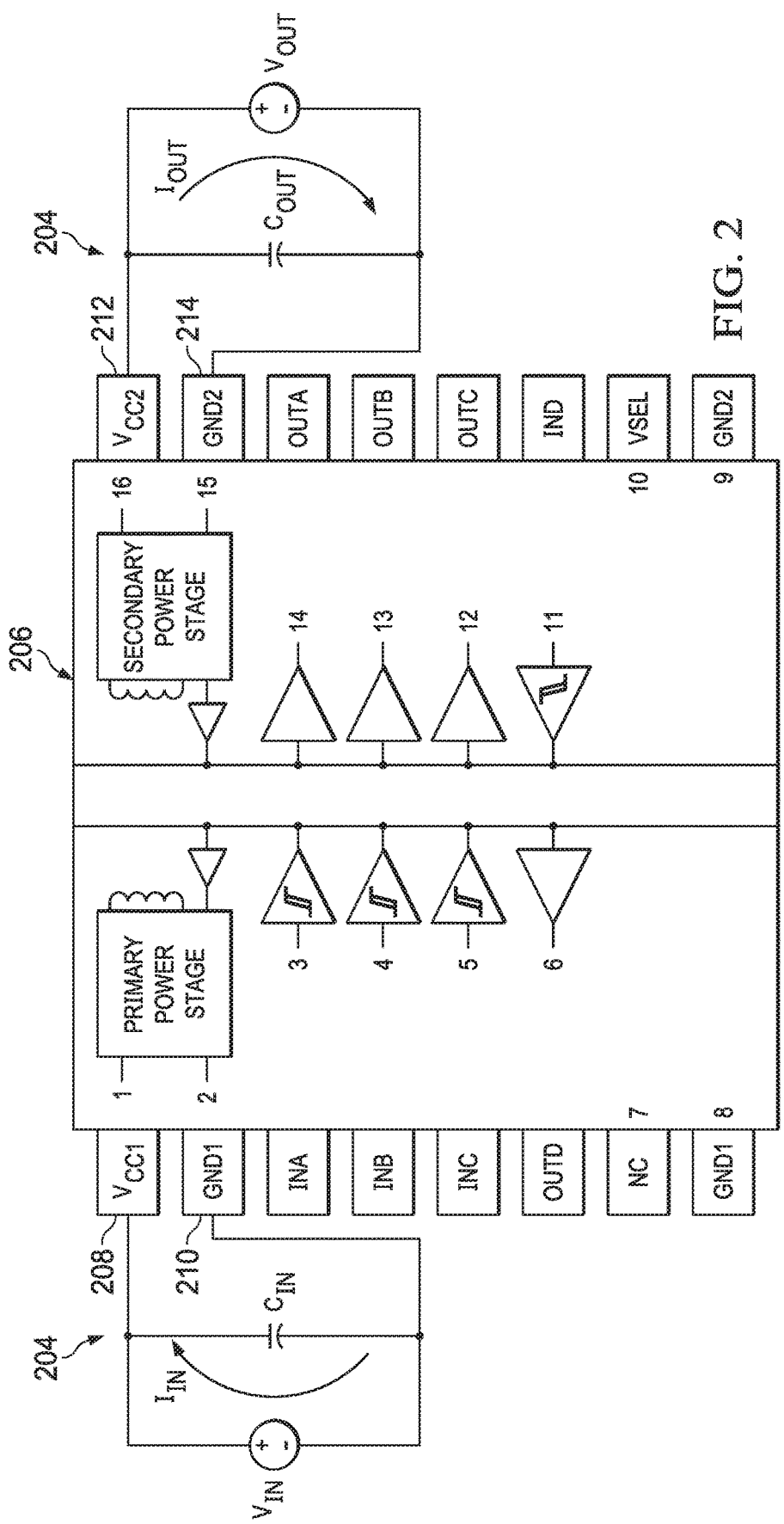
FIG. 2 shows a circuit representation of an ATE contactor interfacing with a DUT in accordance with various examples.

FIG. 2 shows an example where the DUT 106 is a packaged device 206 having various pins, with portions of the ATE contactor 204 that contact a power converter of the packaged device 206 represented by their circuit diagrams. A primary side of the power converter includes voltage and ground pins 208, 210, while a secondary side of the power converter includes voltage and ground pins 212, 214. To perform a Max Iout test, for example, of the power converter of the device 206, the ATE controller 102 applies a voltage through ATE contactor 204 to the primary side of the power converter 208, 210, shown here as primary side voltage source Vin. The ATE controller 102 also applies a voltage through ATE contactor 204 to the secondary side of the power converter 212, 214, shown here as secondary side voltage source Vout, such that the secondary side voltage is below a regulation threshold of the power converter, which ensures 100% on time for the converter. The current from the device 206 into the secondary voltage source Vout under these conditions is the Max Iout specification of the device 206.

Figure 3:
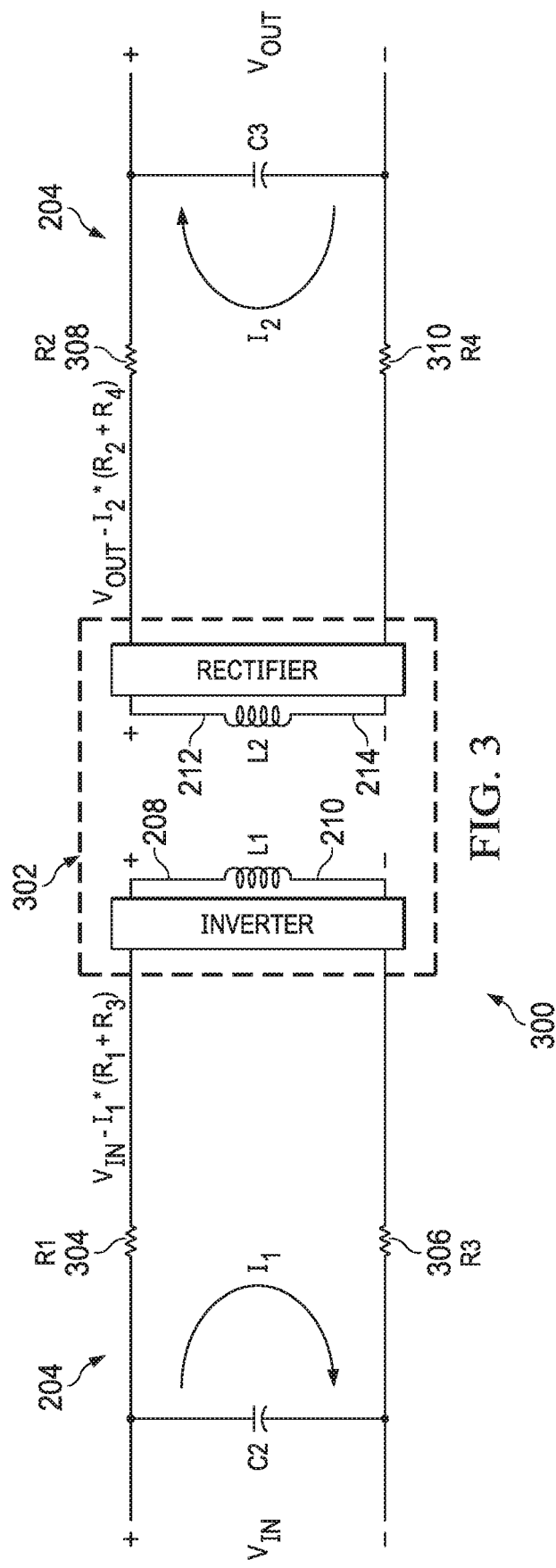
FIG. 3 shows a circuit representation of the ATE contactor interfacing with a power converter of the DUT in accordance with various examples.

FIG. 3 shows a circuit diagram equivalent 300 of the example of FIG. 2. In the circuit diagram 300, the power converter is represented by a transformer 302, with a voltage applied to the primary side of the transformer 302 by way of pins 208, 210 as described above, and a voltage applied to the secondary side of the transformer 302 by way of pins 212, 214 as described above. Additionally, as explained, the ATE contactor 204 includes DC resistance components on both the primary and secondary sides, which are represented by resistors 304, 306, 308, 310. The ATE controller 102 applies voltages Vin and Vout through ATE contactor 204 to the primary and secondary sides of the transformer 302, respectively; however, the voltage actually seen at the pins 208, 210 is reduced by the amount of voltage across resistors 304, 306, while the voltage actually seen at the pins 212, 214 is increased by the voltage across resistors 308, 310. This parasitic resistance of the ATE contactor 204 worsens the Max Iout capability of the transformer 302 of the device 206.

Figure 4:
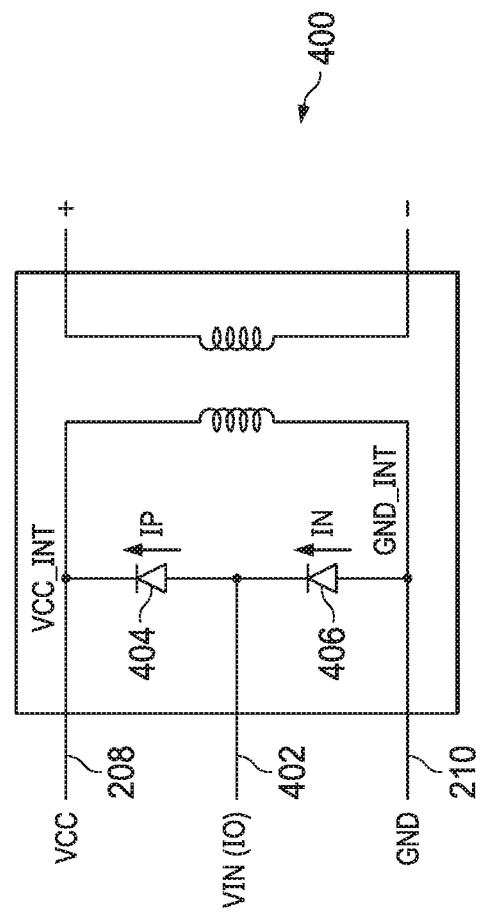
FIG. 4 shows a circuit representation of power, ground, and input/output pins of the DUT in accordance with various examples.

FIG. 4 shows another detail 400 of the primary side of transformer 302, including the voltage pins 208, 210. Additionally, an input/output (I/O) pin 402 is shown schematically as being disposed between the voltage pins 208, 210. Similar to the pins 208, 210, the ATE contactor 104 is configured to interface with the I/O pin 402 as well. An electrostatic discharge (ESD) diode 404 is disposed between the I/O pin 402 and the voltage pin 208, while another ESD diode 406 is disposed between the I/O pin 402 and the ground pin 210. Although not shown in FIG. 4, a similar pin and diode arrangement exists on the secondary side of the transformer 302.

Examples of the present disclosure leverage the I/O pin 402 and the ESD diodes 404, 406 to measure the internal voltage across the primary and secondary sides of the transformer 302, which allows for an estimation of the ATE contactor 104 resistance, and controlling the voltages applied by the ATE contactor 104 for a Max Iout test, or another test where an ATE contactor 104 series resistance value is critical to the test effectiveness, to compensate for the voltage drop/increase due to the ATE contactor 104 resistance. For example, in FIG. 4, the voltage of the I/O pin 402 is given by the following:

VIN=$V_F$+VCC_INT, for the biasing positive diode 404; and

VIN=-$V_F$+GND_INT, for the biasing negative diode 406, where $V_F$ is the voltage across the diode. Similar equations are used for the secondary side of the transformer 302, with VISO_INT replacing VCC_INT. These equations are not used directly for estimation of the internal voltage across the primary and secondary sides of the transformer 302 both because the diodes 404, 406 have process and temperature dependence, or variability, and because of an unknown ATE contactor 104 resistance on the I/O pin 402.

Figure 5A:
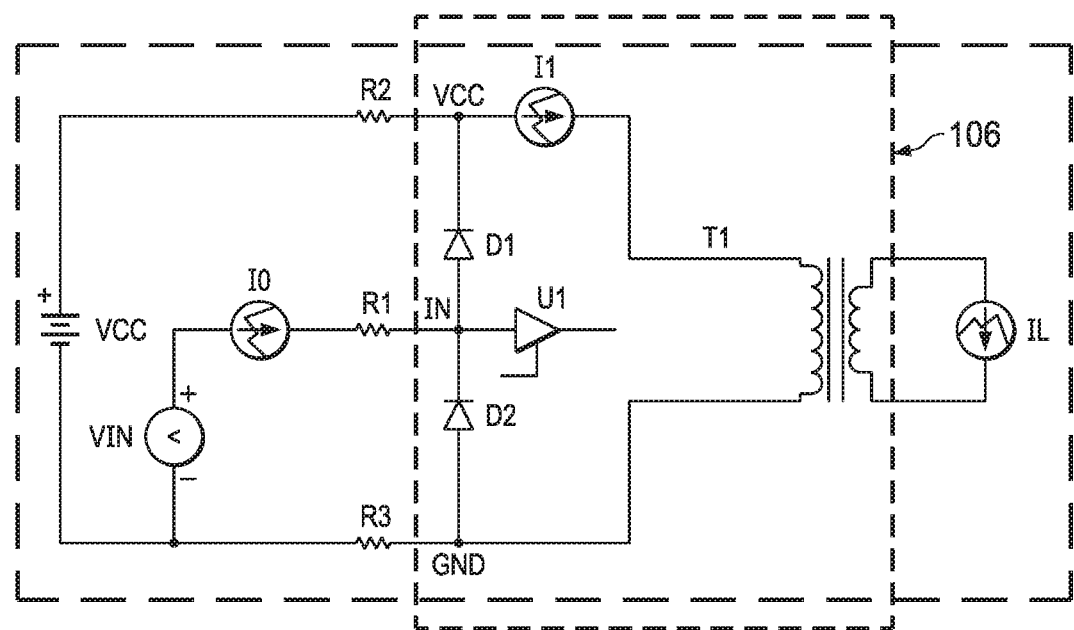
FIGS. 5a and 5b show circuit representations of primary and secondary sides of the power converter of the DUT interfacing with the ATE contactor in accordance with various examples.
Figure 5B:
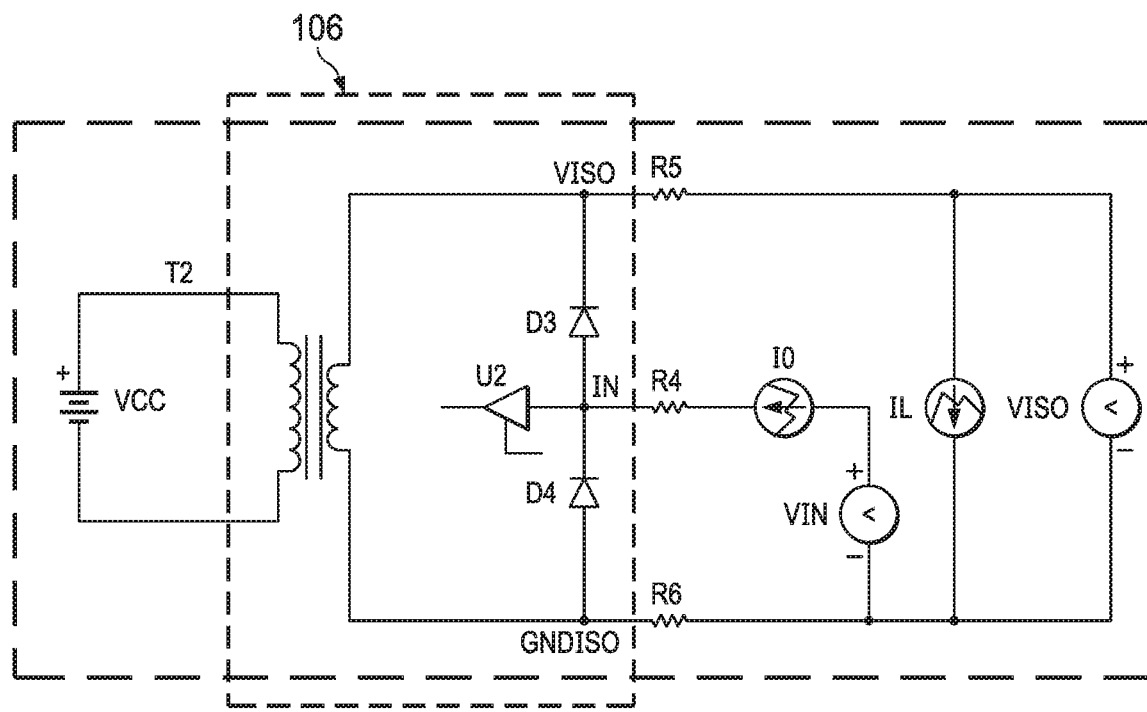

Turning to FIGS. 5a and 5b, to avoid the above variables, examples of the present disclosure include the controller 102 causing the ATE contactor 104 to vary the load on the power converter of the DUT 106 to obtain different combinations of measured voltages and currents. The ATE contactor 104 resistance is estimated based on the values observed by the controller 102 when the load on the power converter of the device 106 is varied.

In particular, with regard to FIG. 5a, the controller 102 causes the ATE contactor 104 to vary the load current IL, which alters the I1 current drawn by the primary side. The controller 102 also causes the ATE contactor 104 to keep the current I0 constant. The controller 102 measures, via the ATE contactor 104 and at first and second load current (IL) values, a voltage on the primary side I/O pin (VIN), a voltage on the primary side of the power converter (VCC), and an input current on the primary side of the power converter (I1). The following equations can be used to estimate the VCC path resistance (R2):

$VCC\_1=VIN\_1+I0*R1+VD1-I1\_1*R2$ $VCC\_2=VIN\_2+I0*R1+VD1-I1\_2*R2$ $VCC\_1-VCC\_2=(VIN\_1-VIN\_2)-(I1\_1-I1\_2)*R2$ $R2=((VIN\_1-VIN\_2)-(VCC\_1-VCC\_2))/(I1\_1\_2)$

Similarly, the following equations can be used to estimate the GND path resistance (R3):

$VIN\_1=-I0*R1-VD2+I1\_1*R3$ $VIN\_2=-I0*R1-VD2+I1\_2*R3$ $VIN\_1-VIN\_2=(I1\_1-I1\_2)*R3$ $R3=(VIN\_1-VIN\_2)/(I1\_1-I1\_2)$

Regarding FIG. 5b, the controller 102 causes the ATE contactor 104 to vary the load current IL and to keep the current I0 constant. The controller 102 measures, via the ATE contactor 104 and at first and second load current (IL) values, a voltage on the secondary side I/O pin (VIN) and a voltage on the secondary side of the power converter (VISO). The following equations can be used to estimate the VISO path resistance (R5):

$VISO\_1=VIN\_1+I0*R4+VD3-IL\_1*R5$ $VISO\_2=VIN\_2+I0*R4+VD3-IL\_2*R5$ $VISO\_1-VISO\_2=VIN\_1-VIN\_2-(IL\_1-IL\_2)*R5$ $R5=((VIN\_1-VIN\_2)-(VISO\_1-VISO\_2))/(IL\_2)$

Similarly, the following equations can be used to estimate the GNDISO path resistance (R6):

$VIN\_1=-I0*R4-VD4+IL\_1*R6$ $VIN\_2=-I0*R4-VD4+IL\_2*R6$ $VIN\_1-VIN\_2=(IL\_1-IL\_2)*R6$ $R6=(VIN\_1-VIN\_2)/(IL\_1-IL\_2)$

The primary side ATE contactor 104 resistance (the total resistance in the VCC-GND path) is the sum of R2 and R3 (Rprimary), while the secondary side ATE contactor 104 resistance (the total resistance in the VISO-GNDISO path) is the sum of R5 and R6 (Rsecondary). Once the primary and secondary side ATE contactor 104 resistances have been estimated, the controller 102 then interfaces with the ATE contactor 104 to perform a Max Iout test of the DUT 106 by applying voltages that compensate for the voltage drop/increase due to the primary and secondary side ATE contactor 104 resistances. Stated another way, the Max Iout test is conducted with the appropriate voltages (e.g., per a specification for the DUT 106) applied to the internal nodes of the power converter of the DUT 106.

Figure 6:
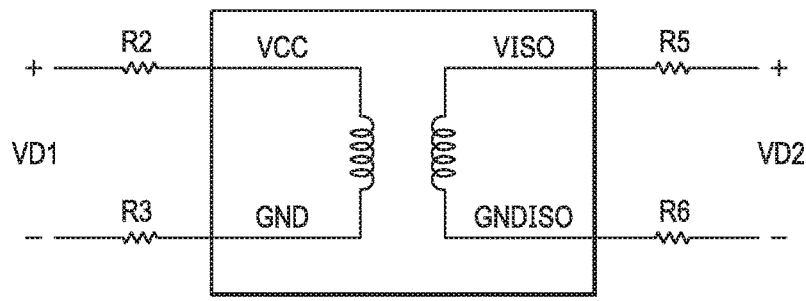
FIG. 6 shows another circuit representation of the power converter of the DUT in accordance with various examples.

Referring to FIG. 6, a primary voltage applied to the primary side of the power converter is shown as Vd1, while a secondary voltage applied to the secondary side of the power converter is shown as Vd2. Initially, the voltages applied to the primary and secondary sides of the power converter are determined by datasheet conditions for the DUT 106 Max Iout test specification (e.g., Vd and Visof). In other words, initially, Vd1=Vd and Vd2=Visof. The controller 102 applies Vd1 and Vd2 and measures, through the ATE contactor 104, a current drawn (ICC) from the primary side voltage source (VCC in FIG. 5a) and a current sunk (IISO) by the secondary side voltage source (VISO in FIG. 5b). The controller 102 then determines an updated Vd1 and an updated Vd2:

$Vd1=Vd+ICC*Rprimary$ $Vd2=Visof-IISO*Rsecondary$

The controller 102 then applies the determined Vd1 and Vd2 and again measures ICC_new and IISO_new. The controller 102 then determines Vd1_new and Vd2_new:

$Vd1\_new=Vd+ICC\_new*Rprimary$ $Vd2\_new=Visof-IISO\_new*Rsecondary$

If the difference between the determined voltages Vd1_new and Vd2_new and the previously-applied primary and secondary voltages Vd1 and Vd2 does not exceed a threshold value, then the controller 102 causes the ATE contactor 104 to perform a Max Iout test of the DUT 106 using the determined voltages Vd1_new and Vd2_new. For example, the threshold is a percentage difference (e.g., 10%), or an absolute voltage difference (e.g., 0.2V). However, if the difference between the determined voltages Vd1_new and Vd2_new and the previously-applied primary and secondary voltages Vd1 and Vd2 exceeds the threshold value, then the controller 102 updates Vd1=Vd1_new and Vd2=Vd2_new and applies Vd1 and Vd2 as explained above. The application of Vd1 and Vd2, measuring of the resultant currents ICC_new and IISO_new, determination of Vd1_new and Vd2_new, and comparison to the previously-applied Vd1 and Vd2, explained above, continues until the difference between the determined voltages Vd1_new and Vd2_new and the previously-applied primary and secondary voltages Vd1 and Vd2 does not exceed the threshold value.

As explained above, when the difference between Vd1_new and Vd1 and the difference between Vd2_new and Vd2 is less than a threshold value, a Max Iout test of the DUT 106 is performed. In other examples, another test where an ATE contactor 104 series resistance value is critical to the test effectiveness may be performed instead of a Max Iout test. In this way, the controller 102 compensates for the estimated ATE contactor 104 resistance and applies primary and secondary side voltages that are appropriate for a particular test of the DUT 106. The controller 102 estimates the ATE contactor 104 resistances and corrects the voltages applied to the DUT 106 for a particular test each time the ATE contactor 104 is used to test a new DUT 106. As a result, the DUT 106 does not need to be overdesigned for a given specification, or have its specification underrated. Further, fewer DUTs 106 will be erroneously identified as failing various tests, such as their Max Iout test, as a result of the proper voltage for such a test being applied to the internal nodes of the power converters of the DUTs 106.

Figure 7:
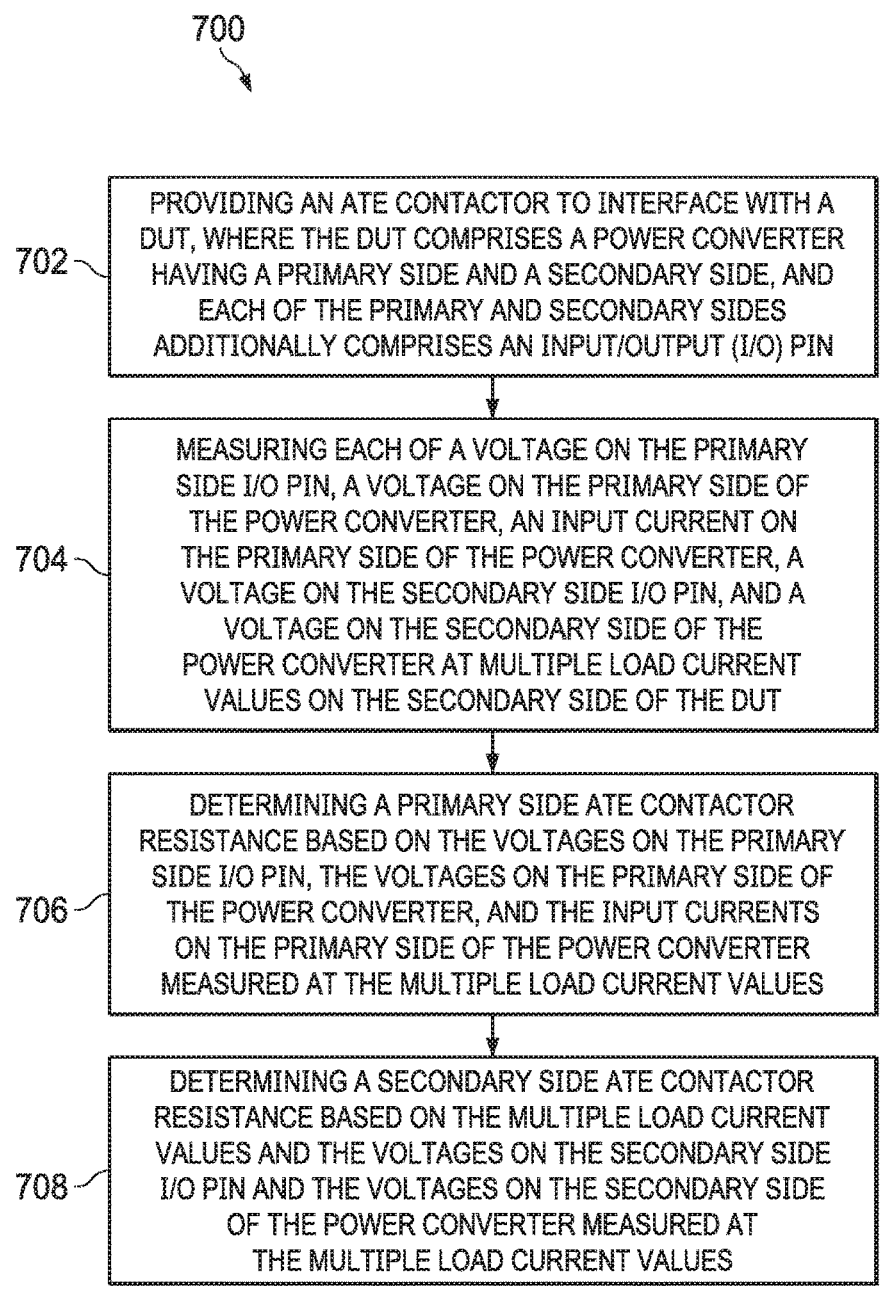
FIG. 7 shows a flow chart of a method for performing a Max Iout test in accordance with various examples.

Turning now to FIG. 7, a method 700 for controlling an automated test equipment (ATE) contactor is shown in accordance with various examples. The method 700 begins in block 702 with providing the ATE contactor to interface with a DUT, where the DUT comprises a power converter having a primary side and a secondary side, and each of the primary and secondary sides additionally comprises an input/output (I/O) pin. The method 700 continues in block 704 with measuring each of a voltage on the primary side I/O pin, a voltage on the primary side of the power converter, an input current on the primary side of the power converter, a voltage on the secondary side I/O pin, and a voltage on the secondary side of the power converter at multiple load current values on the secondary side of the DUT.

The method 700 then continues in block 706 with determining a primary side ATE contactor resistance based on the voltages on the primary side I/O pin, the voltages on the primary side of the power converter, and the input currents on the primary side of the power converter measured at the multiple load current values. Finally, the method 700 concludes in block 708 with determining a secondary side ATE contactor resistance based on the multiple load current values and the voltages on the secondary side I/O pin and the voltages on the secondary side of the power converter measured at the multiple load current values.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
    a controller for an automated test equipment (ATE) contactor configured to interface with a device under test (DUT) comprising a power converter having a primary side and a secondary side, each of the primary and secondary sides additionally comprising an input/output (I/O) pin, the controller configured to:
        cause the ATE contactor to apply a load current on the secondary side of the power converter at a first value;
        receive a first indication from the ATE contactor of a voltage on the primary side I/O pin, a voltage on the primary side of the power converter, an input current on the primary side of the power converter, a voltage on the secondary side I/O pin, and a voltage on the secondary side of the power converter when the load current is the first value;
        cause the ATE contactor to vary the load current to a second value;
        receive a second indication from the ATE contactor of the voltage on the primary side I/O pin, the voltage on the primary side of the power converter, the input current on the primary side of the power converter, the voltage on the secondary side I/O pin, and the voltage on the secondary side of the power converter when the load current is the second value;
        determine a primary side ATE contactor resistance based on the first and second indications of the voltage on the primary side I/O pin, the voltage on the primary side of the power converter, and the input current on the primary side of the power converter; and
        determine a secondary side ATE contactor resistance based on the first and second load current values and the first and second indications of the voltage on the secondary side I/O pin and the voltage on the secondary side of the power converter.

2. The system of claim 1 wherein the controller further comprises a primary side voltage source configured to couple to the primary side of the power converter and a secondary side voltage source configured to couple to the secondary side of the power converter, the controller is further configured to:
    a) cause the primary and secondary side voltage sources to apply a primary voltage and a secondary voltage to the primary and secondary sides of the power converter, respectively;
    b) measure a current drawn from the primary side voltage source and a current sunk by the secondary side voltage source;
    c) determine an updated primary voltage and an updated secondary voltage based on initially-applied primary and secondary voltages, the primary and secondary side ATE contactor resistances, the current drawn from the primary side voltage source, and the current sunk by the secondary side voltage source; and
    d) determine whether a difference between the updated primary and secondary voltages and the applied primary and secondary voltages exceeds a threshold value and, if so, cause the primary and secondary side voltage sources to apply the updated primary and secondary voltages to the primary and secondary sides of the power converter, respectively, and return to (b).

3. The system of claim 2 wherein the controller is further configured to, as a result of the difference being less than the threshold value, determine a maximum output current value based on the current sunk by the secondary side voltage source.

4. The system of claim 2 wherein the initial primary and secondary voltages are values specified by a datasheet for the DUT for a maximum output current test specification.

5. The system of claim 1 wherein the controller is further configured to control a current into each of the I/O pins such that those currents remain constant.

6. The system of claim 1 wherein the controller is configured to determine primary and secondary side ATE contactor resistances each time the ATE contactor interfaces with a new DUT.

7. A method for controlling an automated test equipment (ATE) contactor, the method comprising:
providing the ATE contactor to interface with a device under test (DUT), the DUT comprising a power converter having a primary side and a secondary side, each of the primary and secondary sides additionally comprising an input/output (I/O) pin;
measuring each of a voltage on the primary side I/O pin, a voltage on the primary side of the power converter, an input current on the primary side of the power converter, a voltage on the secondary side I/O pin, and a voltage on the secondary side of the power converter at multiple load current values on the secondary side of the DUT;
determining a primary side ATE contactor resistance based on the voltages on the primary side I/O pin, the voltages on the primary side of the power converter, and the input currents on the primary side of the power converter measured at the multiple load current values; and
determining a secondary side ATE contactor resistance based on the multiple load current values and the voltages on the secondary side I/O pin and the voltages on the secondary side of the power converter measured at the multiple load current values.

8. The method of claim 7 further comprising:
a) providing the controller with a primary side voltage source configured to couple to the primary side of the power converter through the ATE contactor and a secondary side voltage source configured to couple to the secondary side of the power converter through the ATE contactor;
b) applying a primary voltage and a secondary voltage to the primary and secondary sides of the power converter, respectively;
c) measuring a current drawn from the primary side voltage source and a current sunk by the secondary side voltage source;
d) determining an updated primary voltage and an updated secondary voltage based on initially-applied primary and secondary voltages, the primary and secondary side ATE contactor resistances, the current drawn from the primary side voltage source, and the current sunk by the secondary side voltage source; and
e) determining whether a difference between the updated primary and secondary voltages and the applied primary and secondary voltages exceeds a threshold value and, if so, cause the primary and secondary side voltage sources to apply the updated primary and secondary voltages to the primary and secondary sides of the power converter, respectively, and return to (c).

9. The method of claim 8 further comprising, as a result of the difference being less than the threshold value, determining a maximum output current value based on the current sunk by the secondary side voltage source.

10. The method of claim 8 further comprising selecting initial primary and secondary voltages are values specified by a datasheet for the DUT for a maximum output current test specification.

11. The method of claim 7 further comprising controlling a current into each of the I/O pins such that those currents remain constant.

12. The method of claim 7 further comprising determining primary and secondary side ATE contactor resistances each time the ATE contactor interfaces with a new DUT.

13. A system comprising:
a controller for an automated test equipment (ATE) contactor configured to interface with a device under test (DUT) comprising a power converter having a primary side and a secondary side, each of the primary and secondary sides additionally comprising an input/output (I/O) pin, the controller configured to:
measure each of a voltage on the primary side I/O pin, a voltage on the primary side of the power converter, an input current on the primary side of the power converter, a voltage on the secondary side I/O pin, and a voltage on the secondary side of the power converter, at multiple load current values on the secondary side of the DUT;
determine a primary side ATE contactor resistance based on the voltages on the primary side I/O pin, the voltages on the primary side of the power converter, and the input currents on the primary side of the power converter measured at the multiple load current values; and
determine a secondary side ATE contactor resistance based on the multiple load current values and the voltages on the secondary side I/O pin and the voltages on the secondary side of the power converter measured at the multiple load current values.

14. The system of claim 13 wherein the controller further comprises a primary side voltage source configured to couple to the primary side of the power converter and a secondary side voltage source configured to couple to the secondary side of the power converter, the controller is further configured to:
a) cause the primary and secondary side voltage sources to apply a primary voltage and a secondary voltage to the primary and secondary sides of the power converter, respectively;
b) measure a current drawn from the primary side voltage source and a current sunk by the secondary side voltage source;
c) determine an updated primary voltage and an updated secondary voltage based on initially-applied primary and secondary voltages, the primary and secondary side ATE contactor resistances, the current drawn from the primary side voltage source, and the current sunk by the secondary side voltage source; and
d) determine whether a difference between the updated primary and secondary voltages and the applied primary and secondary voltages exceeds a threshold value and, if so, cause the primary and secondary side voltage sources to apply the updated primary and secondary voltages to the primary and secondary sides of the power converter, respectively, and return to (b).

15. The system of claim 14 wherein the controller is further configured to, as a result of the difference being less than the threshold value, determine a maximum output current value based on the current sunk by the secondary side voltage source.

16. The system of claim 14 wherein the initial primary and secondary voltages are values specified by a datasheet for the DUT for a maximum output current test specification.

17. The system of claim 13 wherein the controller is further configured to control a current into each of the I/O pins such that those currents remain constant.

18. The system of claim 13 wherein the controller is configured to determine primary and secondary side ATE contactor resistances each time the ATE contactor interfaces with a new DUT.

\* \* \* \* \*